(12) United States Patent
Matsuoka et al.

(10) Patent No.: US 9,818,467 B2
(45) Date of Patent: Nov. 14, 2017

(54) SEMICONDUCTOR MEMORY DEVICE

(71) Applicant: TOSHIBA MEMORY CORPORATION, Minato-ku, Tokyo (JP)

(72) Inventors: Nao Matsuoka, Tokyo (JP); Kosuke Hatsuda, Tokyo (JP); Katsuhiko Hoya, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/264,533

(22) Filed: Sep. 13, 2016

(65) Prior Publication Data

US 2017/0263297 A1 Sep. 14, 2017

Related U.S. Application Data

(60) Provisional application No. 62/306,327, filed on Mar. 10, 2016.

(51) Int. Cl.
*G11C 11/00* (2006.01)
*G11C 11/16* (2006.01)
*G11C 13/00* (2006.01)

(52) U.S. Cl.
CPC ...... *G11C 11/1673* (2013.01); *G11C 11/1675* (2013.01); *G11C 13/0007* (2013.01); *G11C 13/0011* (2013.01); *G11C 13/0061* (2013.01); *G11C 13/0069* (2013.01)

(58) Field of Classification Search
CPC ............ G11C 11/1673; G11C 11/1675; G11C 13/0007; G11C 13/0011; G11C 13/0061; G11C 13/0069; G11C 2213/79; G11C 2013/0073

USPC ......................................................... 365/158
See application file for complete search history.

(56) References Cited

U.S. PATENT DOCUMENTS

| 7,345,907 | B2* | 3/2008 | Scheuerlein | ........ G11C 13/0011 |
| | | | | 365/100 |
| 8,913,416 | B2* | 12/2014 | Kitagawa | ........... G11C 13/0007 |
| | | | | 365/148 |
| 2007/0008786 | A1* | 1/2007 | Scheuerlein | ........ G11C 13/0011 |
| | | | | 365/189.15 |
| 2012/0294064 | A1* | 11/2012 | Kitagawa | ........... G11C 13/0007 |
| | | | | 365/148 |
| 2014/0347919 | A1 | 11/2014 | Aoki | |

FOREIGN PATENT DOCUMENTS

JP 2013054807 A 3/2013
WO 2010125852 A1 11/2010

* cited by examiner

*Primary Examiner* — Pho M Luu
*Assistant Examiner* — Xiaochun L Chen
(74) *Attorney, Agent, or Firm* — Holtz, Holtz & Volek PC

(57) ABSTRACT

According to one embodiment, a semiconductor memory device includes: a first bit line; a first source line; a first word line; a first control line; a first memory cell comprising a first variable resistance element and a first transistor, the first transistor including a gate coupled to the first word line, the first memory cell including one end coupled to the first bit line and another end coupled to the first source line; a second transistor including one end coupled to the first bit line; and a third transistor including a gate coupled to the first control line, one end coupled to the first bit line, and another end coupled to the first source line.

20 Claims, 17 Drawing Sheets

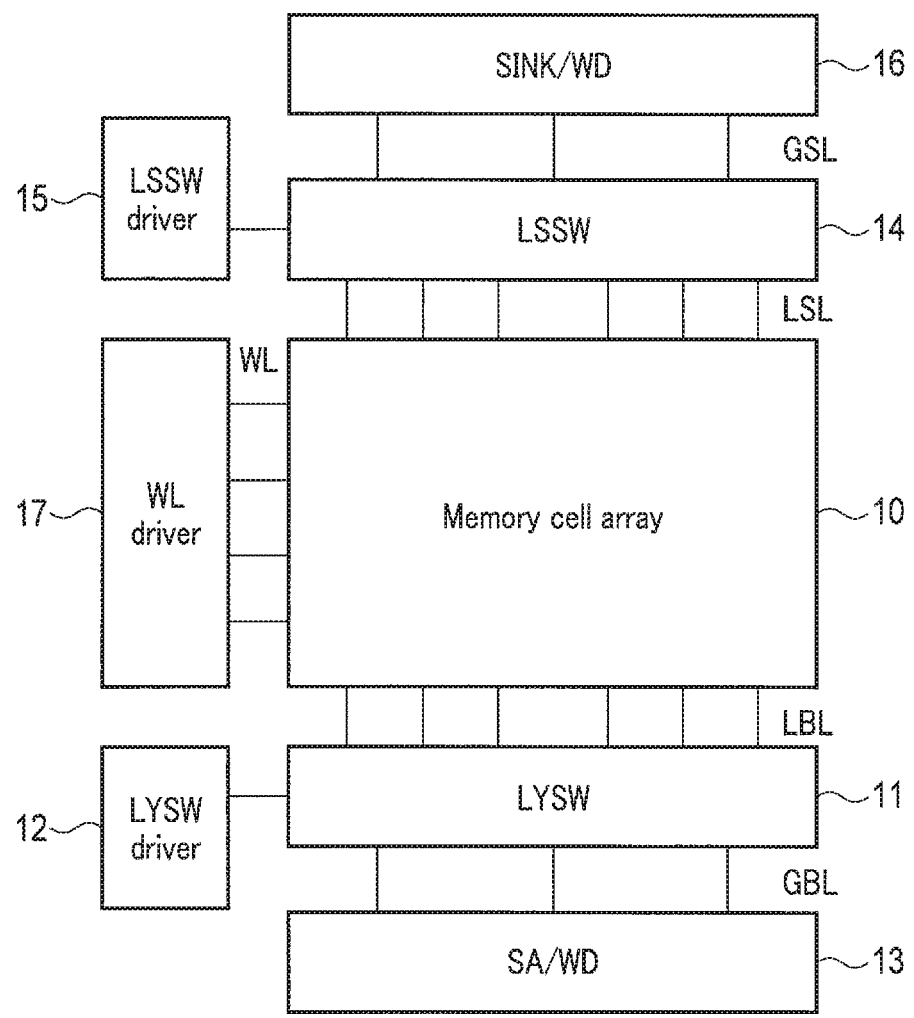
F I G. 1

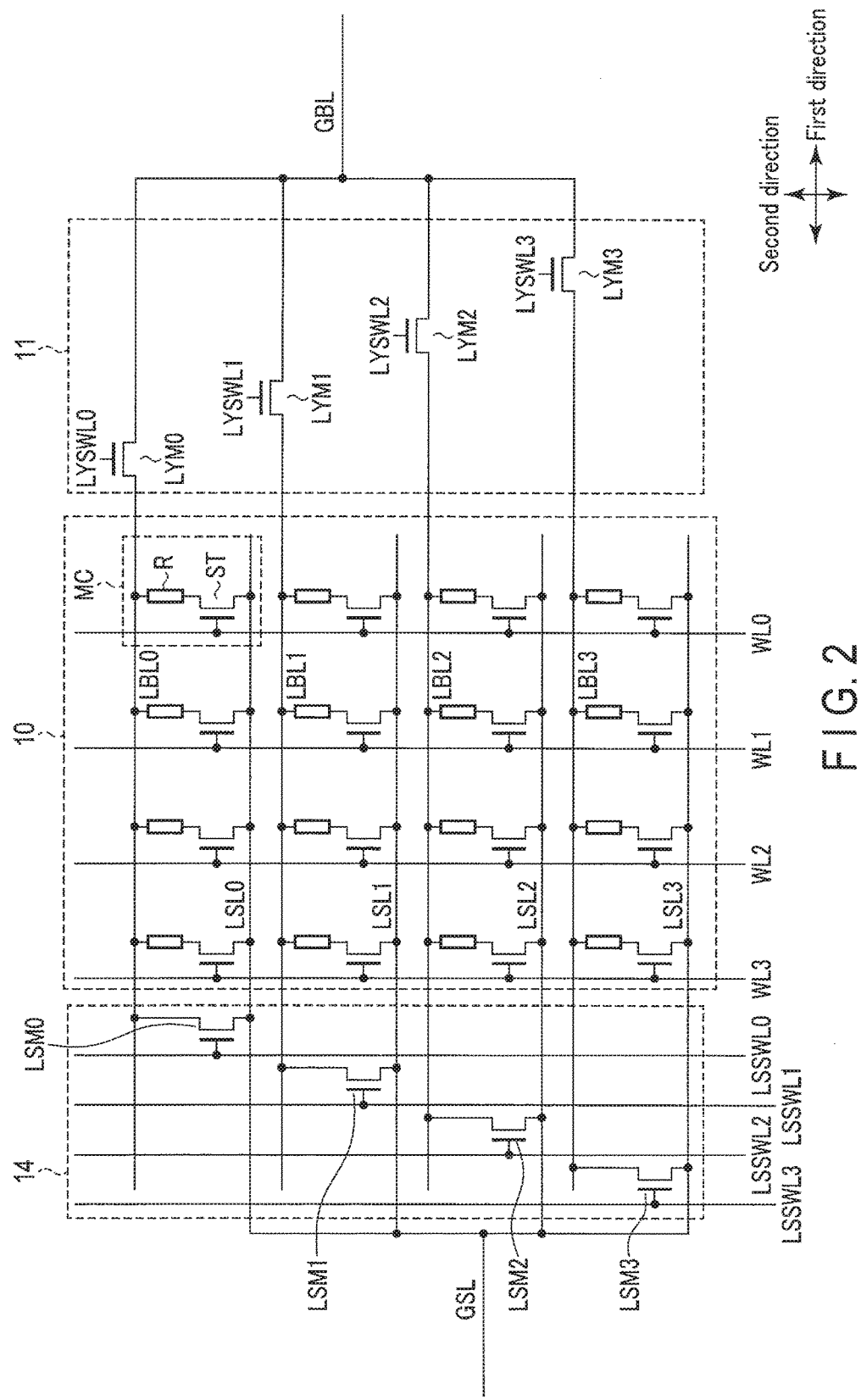
F I G. 2

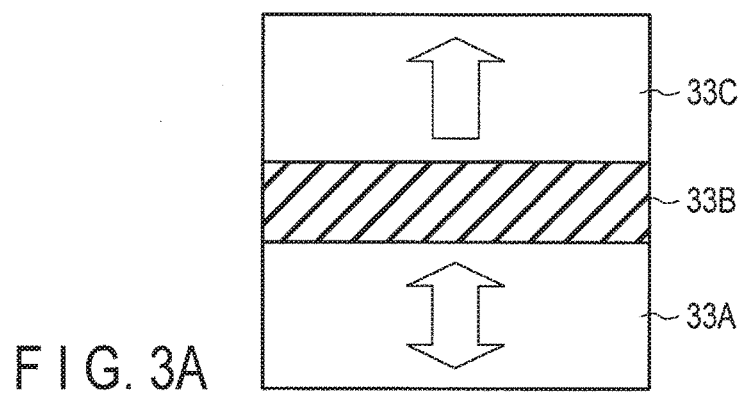
FIG. 3A
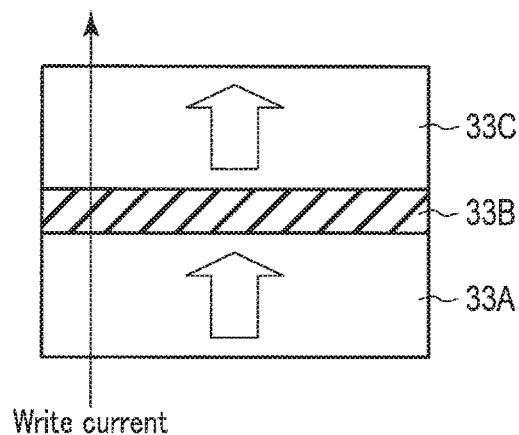
FIG. 3B  Parallel state (low resistance)
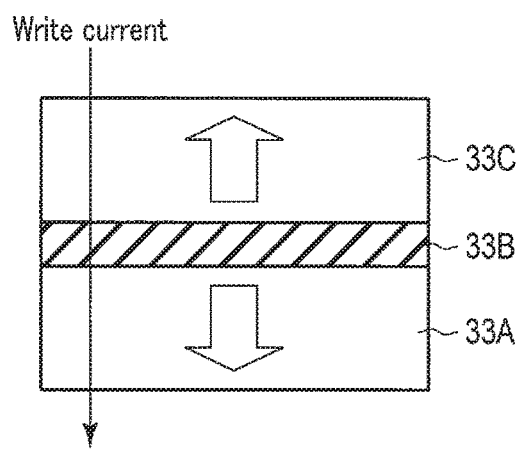
FIG. 3C  Anti-parallel state (high resistance)

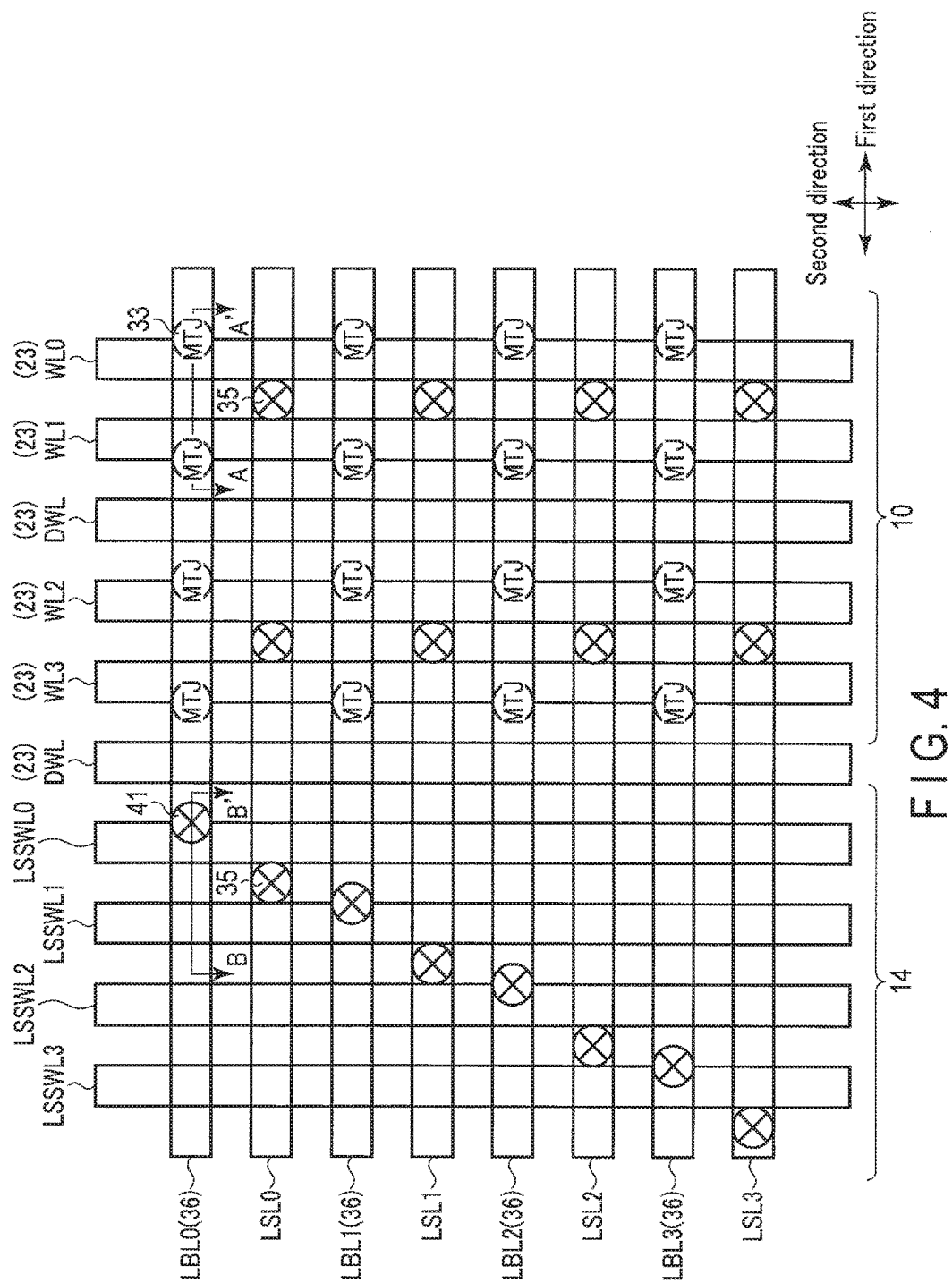
F I G. 4

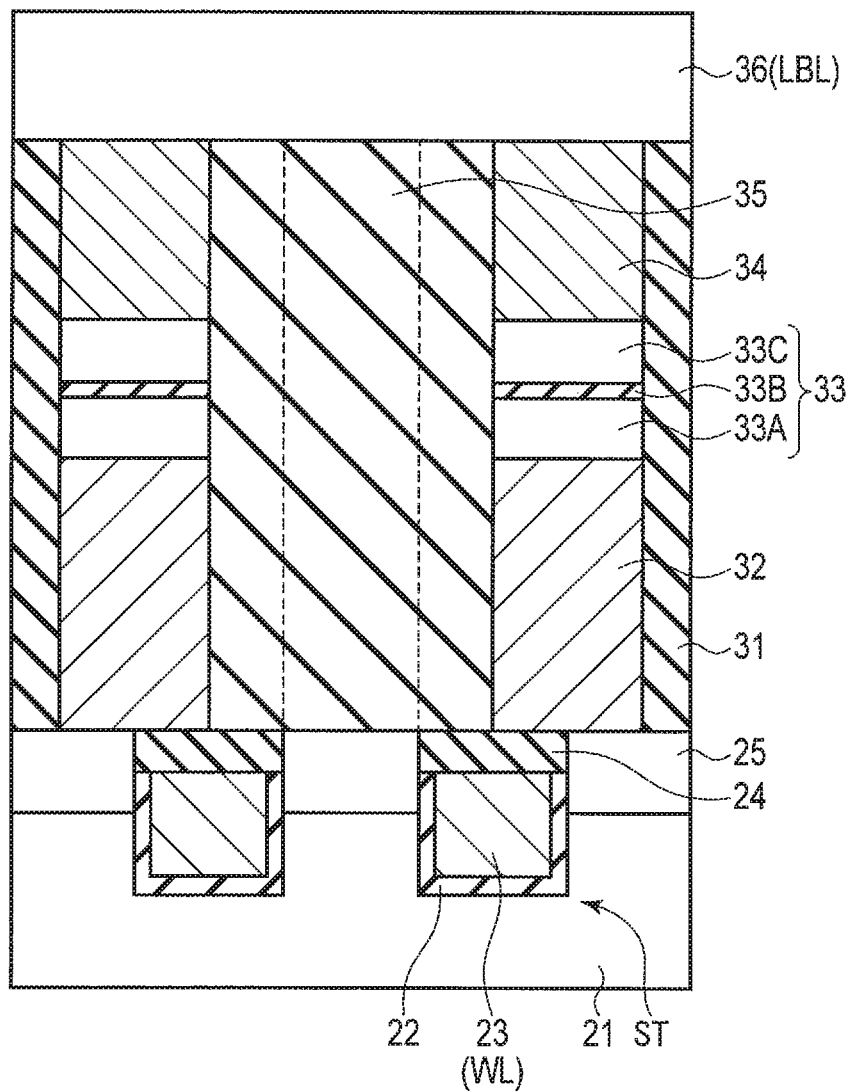
F I G. 5

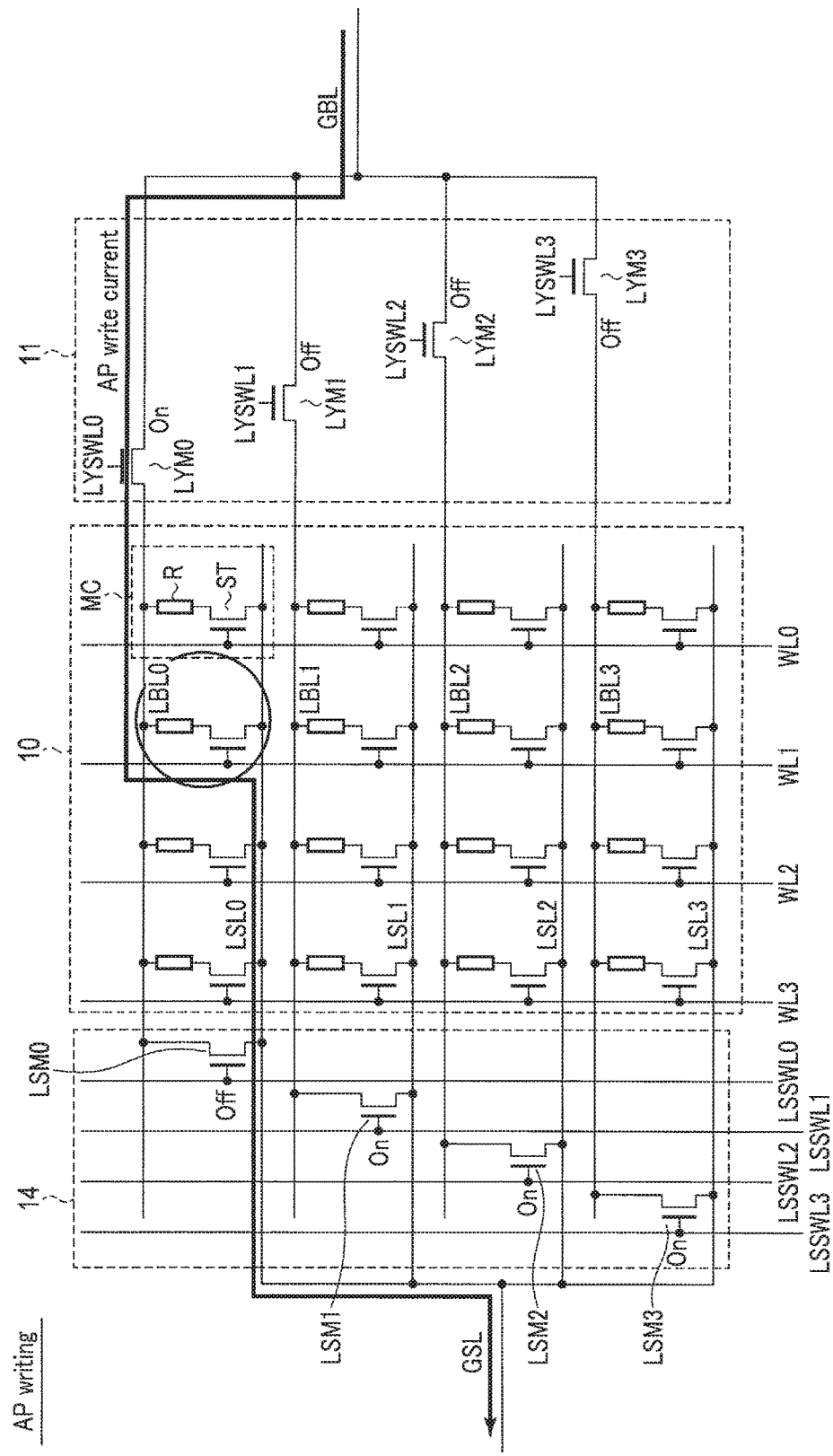
F I G. 8

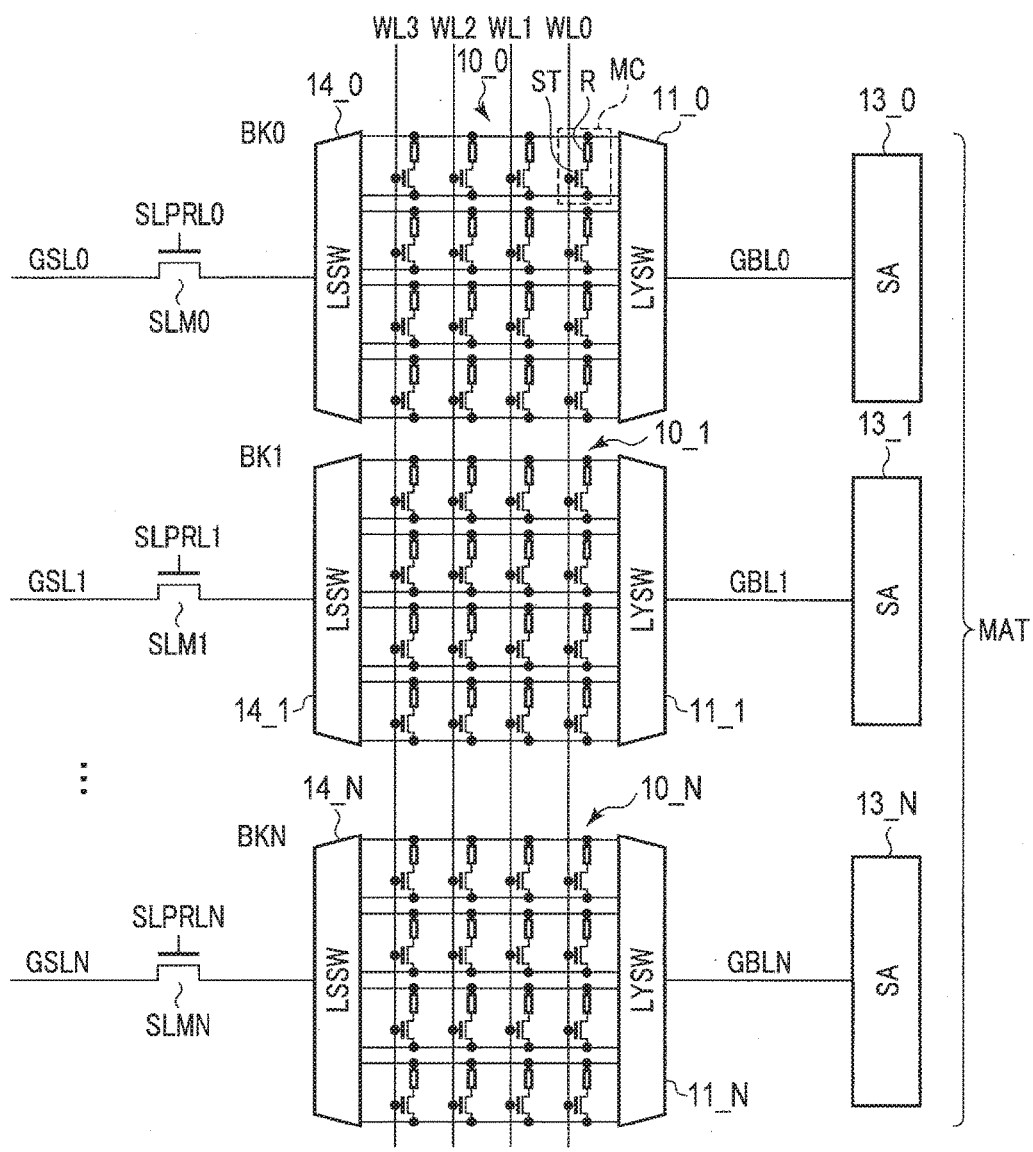
F I G. 12

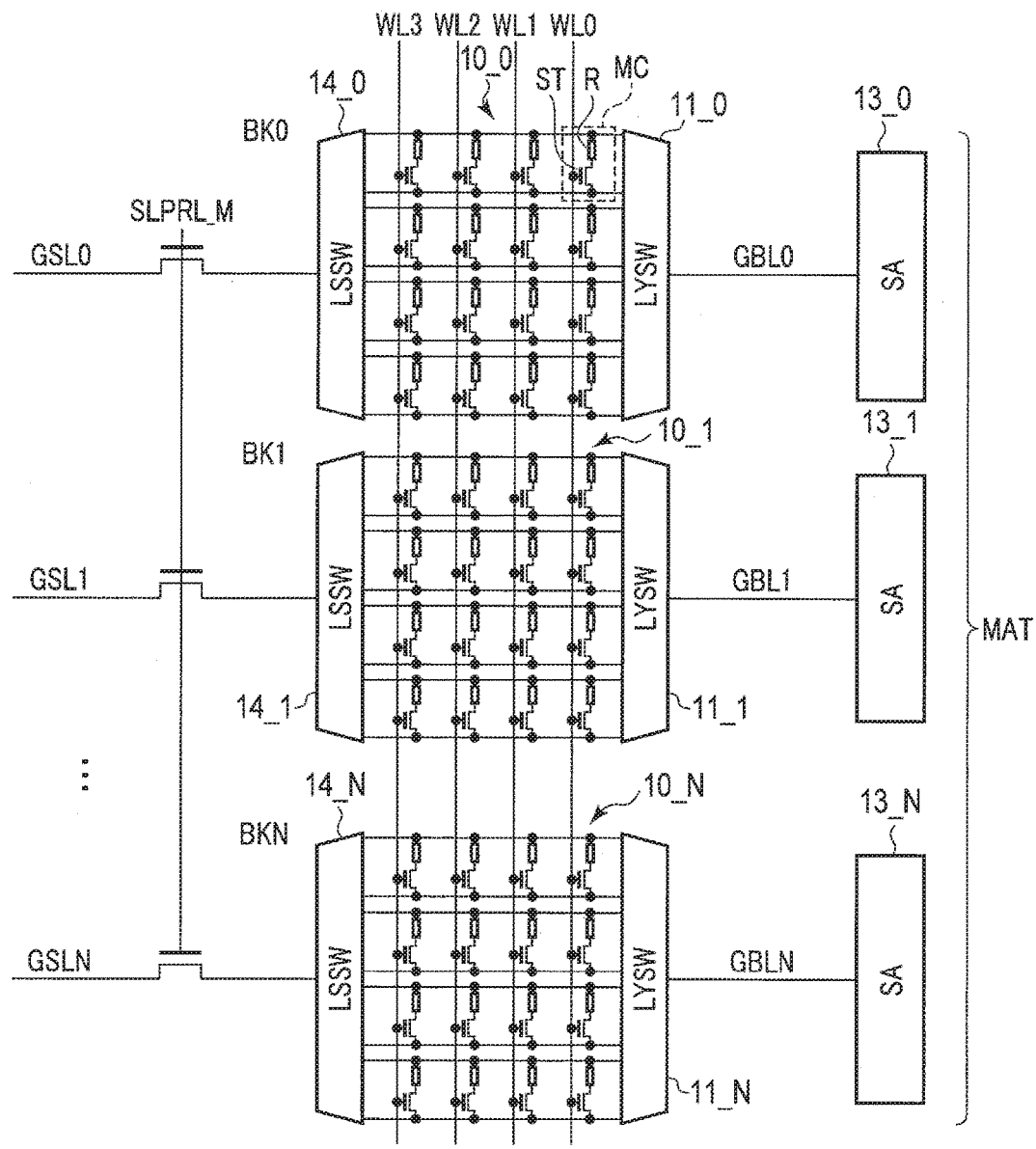
F I G. 14

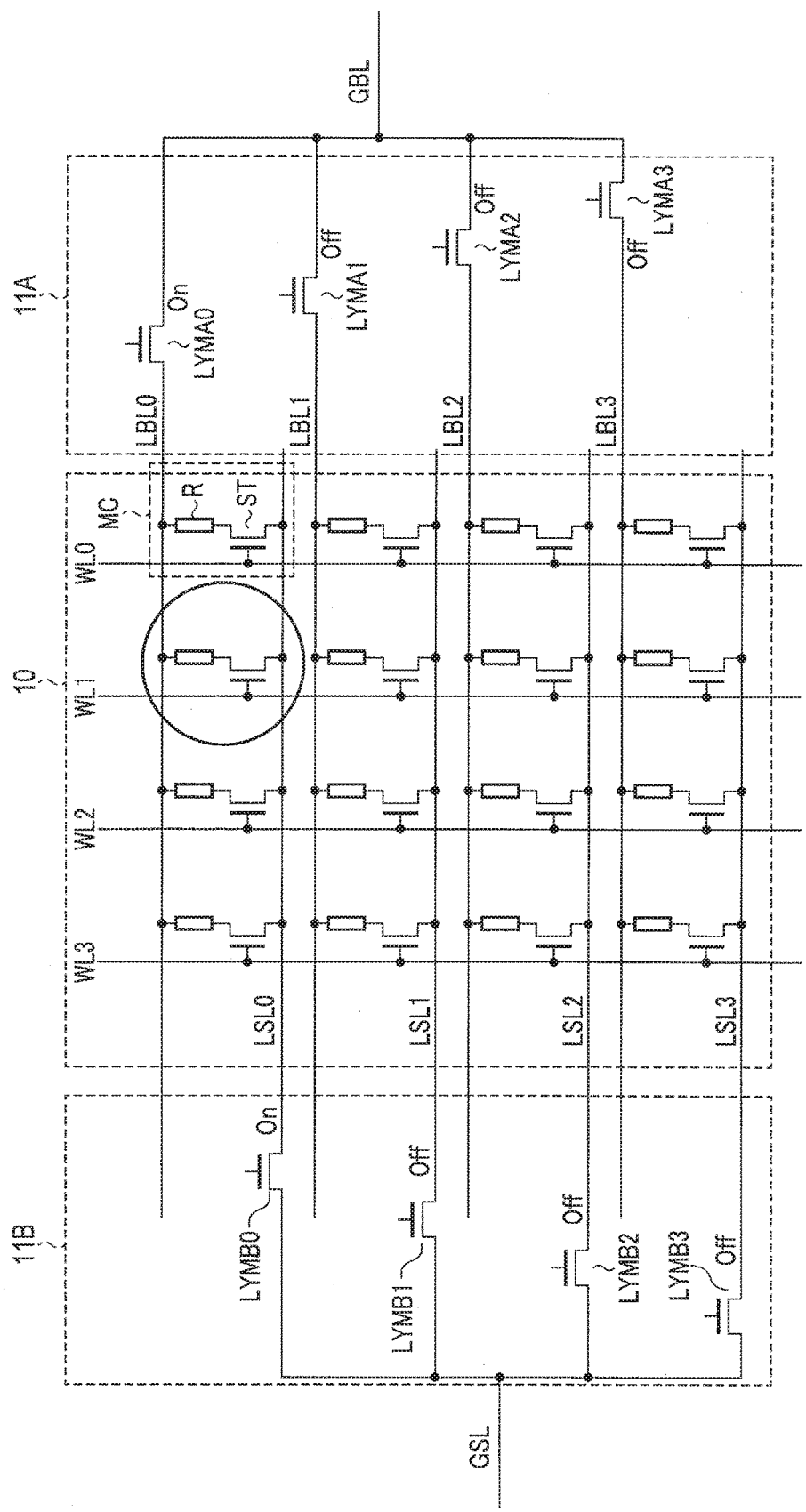
F I G. 16

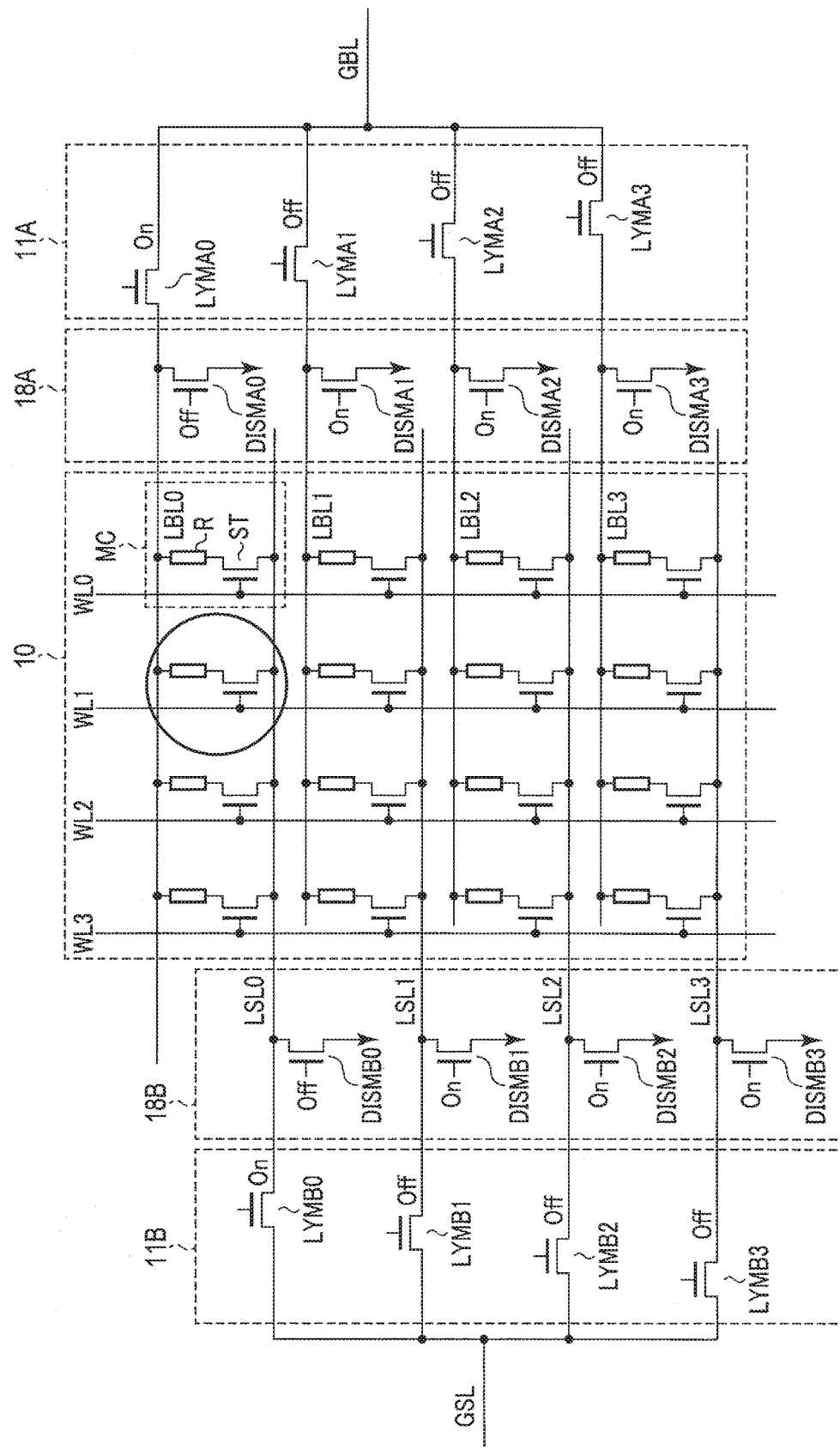
F I G. 17

SEMICONDUCTOR MEMORY DEVICE

CROSS REFERENCE TO RELATED APPLICATIONS

This application is based upon and claims the benefit of priority from U.S. Provisional Application No. 62/306,327, filed Mar. 10, 2016, the entire contents of all of which are incorporated herein by reference.

FIELD

Embodiments described herein relate generally to a semiconductor memory device.

BACKGROUND

A MRAM (Magnetic Random Access Memory) is a memory device, in which a memory element having a magnetoresistance effect is used as a memory cell that stores information. The MRAM is noted as a next-generation memory device characterized by high-speed operation, large-capacity, and non-volatility.

BRIEF DESCRIPTION OF THE DRAWINGS

FIG. 1 is a block diagram showing an overall configuration of a semiconductor memory device according to a first embodiment;

FIG. 2 is a circuit diagram showing configurations of a memory cell array, a local column switch, and a local sink switch in the semiconductor memory device according to the first embodiment;

FIG. 3A is a cross-sectional view showing a schematic configuration of a variable resistance element in the semiconductor memory device according to the first embodiment;

FIG. 3B is a drawing to explain writing at the variable resistance element in the semiconductor memory device according to the first embodiment, and showing a cross-sectional view of the variable resistance element in a P state;

FIG. 3C is a drawing to explain writing at the variable resistance element R in the semiconductor memory device according to the first embodiment, and showing a cross-sectional view of the variable resistance element in an AP state;

FIG. 4 is a plan view showing the memory cell array and the local sink switch in the semiconductor memory device according to the first embodiment;

FIG. 5 is a cross-sectional view taken along A-A' of FIG. 4;

FIG. 8 is a diagram showing AP writing of the semiconductor memory device according to the first embodiment;

FIG. 12 is a circuit diagram showing a configuration of a semiconductor memory device according to a third embodiment;

FIG. 14 is a circuit diagram showing a configuration of a semiconductor memory device according to a modification of the third embodiment;

FIG. 16 is a circuit diagram showing a configuration of a semiconductor memory device according to a first comparative example; and FIG. 17 is a circuit diagram showing a configuration of a semiconductor memory device according to a second comparative example.

DETAILED DESCRIPTION

Figure 6:
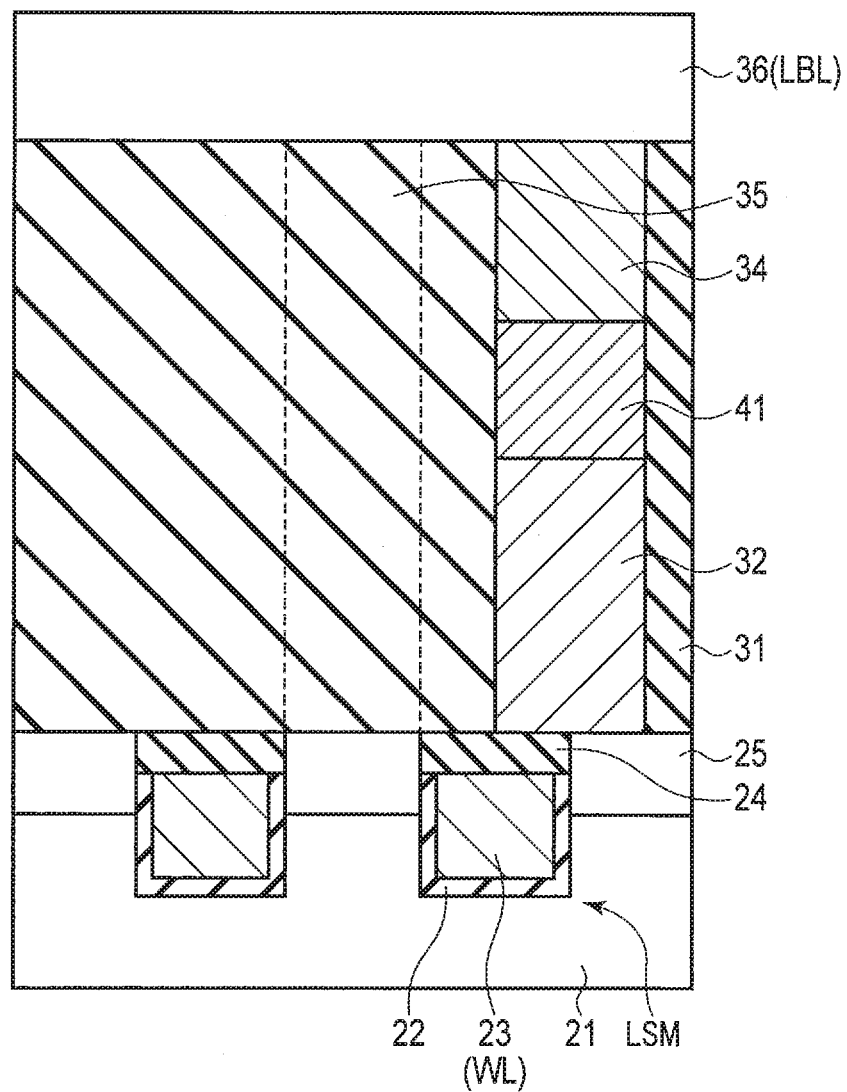
FIG. 6 is a cross-sectional view taken along B-B' of FIG. 4.

In general, according to one embodiment, a semiconductor memory device includes: a semiconductor memory device includes: a first bit line extending in a first direction; a first source line extending in the first direction; a first word line extending in a second direction crossing the first direction; a first control line extending in the second direction; a first memory cell comprising a first variable resistance element and a first transistor, the first transistor including a gate coupled to the first word line, the first memory cell including one end coupled to the first bit line and another end coupled to the first source line; a second transistor including one end coupled to the first bit line; and a third transistor including a gate coupled to the first control line, one end coupled to the first bit line, and another end coupled to the first source line.

Hereinafter, the embodiments will be described with reference to the drawings. In the drawings, identical reference symbols will be applied to identical portions.

First Embodiment

A semiconductor memory device according to the first embodiment will be explained with reference to FIG. 1 to FIG. 10.

Herein, an MRAM for storing data using a magnetoresistive effect element (an MTJ element) as a variable resistance element is explained as an example, but is not limited thereto. The present embodiment is applicable to any general memory that senses a resistance difference between variable resistance elements by converting the resistance difference into a current difference or a voltage difference. Note that in the following explanation the term "connect (couple)" should be construed to include not only a direct connection, but also a connection through any intervening element, unless otherwise mentioned specifically. Also note that one end of a transistor indicates one of a source and a drain, and the other end indicates the other of a source and a drain.

Configuration in First Embodiment

FIG. 1 is a block diagram showing an overall configuration of the semiconductor memory device according to the first embodiment;

As shown in FIG. 1, the semiconductor memory device comprises a memory cell array 10, a local column switch (LYSW) 11, a local column switch driver 12, a sense amplifier/write driver 13, a local sink switch (LSSW) 14, a local sink switch driver 15, a sink/write driver 16, and a word line driver 17.

The memory cell array 10 includes a plurality of MATs. Each MAT includes a plurality of banks. Each bank includes a plurality of memory cells MC that store data. The memory cells MC are arranged in a matrix.

The local column switch 11 selectively couples a local bit line LBL and a global bit line GBL in accordance with a column signal. The local column switch driver 12 generates a column signal, and controls on/off of the local column switch 11.

The sense amplifier/write driver 13 includes a sense amplifier and a write driver (hereinafter may be referred to as the sense amplifier 13 or the write driver 13), and is electrically coupled to the global bit line GBL. The sense amplifier 13 detects a read current or read voltage in a reading operation, thereby reading data from a memory cell MC. The write driver 13 applies a write voltage to the global bit line GBL in writing. As a result, a write current flows out of the write driver, or a write current flows in the write driver 13.

The local sink switch 14 selectively couples a local source line LSL and a global source line GSL in accordance with a sink signal. The local sink switch driver 15 generates a sink signal, and controls on/off of the local sink switch 14.

The sink/write driver 16 includes a sink and a write driver (hereinafter may be referred to as the sink 16 or the write driver 16), and is electrically coupled to the global source line GSL. The sink 16 is, for example, at a ground voltage. In a reading operation, a read current flows in the sink 16. The write driver 16 applies the write voltage to the global source line GSL in writing. As a result, a write current flows out of the write driver 16, or a write current flows in the write driver 16.

The word line driver 17 is electrically coupled to word lines WL, and selects and drives them.

FIG. 2 is a circuit diagram showing configurations of the memory cell array 10, the local column switch 11, and the local sink switch 14 in the semiconductor memory device according to the first embodiment. FIG. 2 shows a bank in the semiconductor memory device.

As shown in FIG. 2, the memory cell array 10 comprises local bit lines LBL0-LBL3, local source lines LSL0-LSL3, and word lines WL0-WL3. The local bit lines LBL0-LBL3 and the local source lines LSL0-LSL3 extend in a first direction. The word lines WL0-WL3 extend in a second direction crossing to the first direction. The memory cell array 10 includes a plurality of memory cells MC. The memory cells MC are respectively located at positions where the word lines WL0-WL3 intersect the local bit lines LBL0-LBL3 and the local source lines LSL0-LSL3. Thus, the memory cells MC are arrayed in a matrix in the first direction and the second direction.

In the explanation below, those lines are referred to as the local bit lines LBL, the local source lines LSL, and the word lines WL, when they are not individually identified. The aforementioned numbers of local bit lines LBL, local source lines LSL, and word lines WL are mere examples, and are not specifically limited.

The memory cell MC includes, for example, a variable resistance element R and a select transistor ST. One end of the variable resistance element R is electrically coupled to the local bit line LBL, and the other end is electrically coupled to one end of the select transistor ST. The other end of the select transistor ST is electrically coupled to the local source line LSL, and the gate of the select transistor ST is electrically coupled to the word line WL.

The variable resistance element R is an element in which its resistance value is varied by applying a current (or voltage) to the variable resistance element R. The variable resistance element R includes, for example, an MTJ element, a phase change element, and a ferroelectric element. The memory cell MC is selected by turning on the select transistor ST through the word line WL. Herein, a case where the MRAM, namely the variable resistance element R, is an MTJ element is explained.

FIG. 3A is a cross-sectional view showing a schematic configuration of a variable resistance element in the semiconductor memory device according to the first embodiment. Herein, as the variable resistance element R, mainly a storage layer 33A, a tunnel barrier layer 33B, and a reference layer 33C are presented.

As shown in FIG. 3A, the variable resistance element R includes a laminated body comprising the storage layer 33A which is a ferromagnetic layer, the reference layer 33C which is a ferromagnetic layer, and the tunnel barrier layer 33B which is a non-magnetic layer formed therebetween.

The storage layer 33A is a ferromagnetic layer in which a magnetization direction is variable, and which has perpendicular magnetic anisotropy; that is, the magnetization direction is perpendicular or almost perpendicular to a film surface (upper surface/lower surface). A variable magnetization direction means that a magnetization direction varies with respect to a preset write current. Being almost perpendicular means that a remanent magnetization direction falls within the range of $45°<\theta\leq90°$ with respect to a film surface. The storage layer 33A is made of, for example, cobalt iron boron (CoFeB) or iron boride (FeB).

The tunnel barrier layer 33B is formed on the storage layer 33A. The tunnel barrier layer 33B is a non-magnetic layer, and is made of MgO, for example.

The reference layer 33C is formed on the tunnel barrier layer 33B. The reference layer 33C is a ferromagnetic layer in which a magnetization direction is non-variable, and which has perpendicular magnetic anisotropy; that is, the magnetization direction is perpendicular or almost perpendicular to the film surface. Herein, a non-variable magnetization direction means that a magnetization direction does not vary with respect to a preset write current. In other words, the reference layer 33C has a greater inverted energy barrier of the magnetization direction than that of the storage layer 33A. The reference layer 33C is made of, for example, cobalt platinum (CoPt), cobalt nickel (CoNi), or cobalt palladium (CoPd).

FIG. 3B is a drawing to explain writing at the variable resistance element R in the semiconductor memory device according to the first embodiment, and shows a cross-sectional view of the variable resistance element in a parallel state (P state). FIG. 3C is a drawing to explain writing at the variable resistance element R in the semiconductor memory device according to the first embodiment, and shows a cross-sectional view of the variable resistance element in an anti-parallel state (AP state).

The variable resistance element R is, for example, a spin injection type variable resistance element. Accordingly, when data is written to the variable resistance element R, or data is read from the variable resistance element R, a current flows in two directions perpendicular to the film surface in the variable resistance element R.

More specifically, data writing to the variable resistance element R is carried out as described below.

As shown in FIG. 3B, when a current flows from the storage layer 33A to the reference layer 33C, in other words, when electrons flowing from the reference layer 33C to the storage layer 33A are supplied, the electrons, which are spin-polarized in the same direction as the magnetization direction of the reference layer 33C, are injected to the storage layer 33A. In this case, the magnetization direction of the storage layer 33A is adapted to the same direction as the magnetization direction of the reference layer 33C. Accordingly, the magnetization direction of the reference layer 33C and the magnetization direction of the storage layer 33A are in a parallel alignment. In the parallel state, the resistance value of the variable resistance element R is the lowest. This case is defined as "0" data, for example.

On the other hand, as shown in FIG. 3C, when a current flows from the reference layer 33C to the storage layer 33A, in other words, when electrons flowing from the storage layer 33A to the reference layer 33C are supplied, the electrons which are spin-polarized in the direction opposite to the magnetization direction of the reference layer 33C are injected to the storage layer 33A because of reflection by the reference layer 33C. In this case, the magnetization direction of the storage layer 33A is adapted to a direction opposite to the magnetization direction of the reference layer 33C. Accordingly, the magnetization direction of the reference layer 33C and the magnetization direction of the storage layer 33A are in an anti-parallel alignment. In the anti-parallel state, the resistance value of the variable resistance element R is the highest. This case is defined as "1" data, for example.

Reading data from the variable resistance element R is carried out as described below.

A read current is supplied to the variable resistance element R. The read current is set to a value which does not cause the magnetization direction of the storage layer 33A to be inverted (a value smaller than the write current). By detecting a resistance value of the variable resistance element R at this point, the "0" data and "1" data can be read.

Referring back to FIG. 2, the local column switch 11 comprises column select transistors LYM0-LYM3. One end of each of the column select transistors LYM0-LYM3 is electrically coupled to each of the local bit lines LBL0-LBL3, and the other ends are electrically coupled to the common global bit line GBL. Gates of each of the column select transistors LYM0-LYM3 are each electrically coupled to control lines LYSWL0-LYSWL3.

The local sink switch 14 includes control lines LSSWL0-LSSWL3 extending in the second direction. The local sink switch 14 also includes sink select transistors LSM0-LSM3. One end of each of the sink select transistors LSM0-LSM3 is electrically coupled to each of the local bit lines LBL0-LBL3, and the other end of each of the sink select transistors LSM0-LSM3 is electrically coupled to each of the local source lines LBL0-LBL3. Gates of each of the sink select transistors LSM0-LSM3 are each electrically coupled to the control lines LSSWL0-LSSWL3.

FIG. 4 is a plan view showing the memory cell array 10 and the local sink switch 14 in the semiconductor memory device according to the first embodiment. FIG. 5 is a cross-sectional view taken along A-A' of FIG. 4. FIG. 6 is a cross-sectional view taken along B-B' of FIG. 4. FIG. 5 and FIG. 6 show a cross section of a variable resistance element 33 (R), as well as a cross section of a contact 35.

As shown in FIG. 4, the memory cell array 10 comprises the local bit lines LBL0-LBL3, the local source lines LSL0-LSL3, and the word lines WL0-WL3. The local bit lines LBL0-LBL3 and the local source lines LSL0-LSL3 extend in the first direction, and alternate in the second direction perpendicular to the first direction. The word lines WL0-WL3 extend in the second direction. Dummy word lines DWL are respectively arranged between the word line WL1 and the word line WL2, and between the word line WL3 and the control line LSSWL0.

As shown in FIG. 5, a semiconductor substrate 21 in the memory cell array 10 includes a select transistor ST using, for example, an n-channel MOSFET. The select transistor ST has a structure obtained by forming a recess in the semiconductor substrate 21 and filling the recess with a gate electrode 23 containing, for example, polysilicon.

More specifically, the select transistor ST comprises a gate insulating layer 22, a gate electrode 23, and two diffusion layers 25 (a drain side diffusion layer and a source side diffusion layer).

The gate insulating layer 22 is formed on an inner surface of a lower portion of the recess provided in a surface region of the semiconductor substrate 21. The recess extends in the second direction. The gate electrode 23 is formed on an inner surface of the gate insulating layer 22 to fill the lower portion of the recess. The gate electrode 23 corresponds to the word line WL. An insulating layer 24 made of, for example, SiN is formed on an upper surface of the gate insulating layer 22 and the gate electrode 23 to fill an upper portion of the recess. The upper surface of the insulating layer 24 is almost flush with the upper surface of the semiconductor substrate 21 (the upper surface of the diffusion layers 25 to be detailed below).

The two diffusion layers 25 are provided on the surface of the semiconductor substrate 21 to sandwich the gate insulating layer 22, the gate electrode 23, and the insulating layer 24. The diffusion layer 25 interposed between the two memory cells adjacent to each other in the first direction are shared by the two adjacent memory cells.

On one diffusion layer 25 (the drain side diffusion layer), a lower electrode 32, a variable resistance element 33, and an upper electrode 34 are provided in this order.

More specifically, the lower electrode 32 is provided to be in contact with a part of the upper surface of one diffusion layer 25 (the drain side diffusion layer) and a part of the upper surface of the insulating layer 24. In other words, the lower electrode 32 partially overlaps the diffusion layer 25 in a plane.

The variable resistance element 33 is formed on and in contact with the upper surface of the lower electrode 32. The variable resistance element 33 has, for example, a circular shape in a plan view, and a columnar shape. In other words, the variable resistance element 33 and the lower electrode 32 overlap in a plane. In FIG. 5, the reference layer 33A, the tunnel barrier layer 33B, and the storage layer 33C are provided in this order. However, the order may be reversed.

The upper electrode 34 is formed on and in contact with the upper surface of the variable resistance element 33. A conductive layer 36 (local bit line LBL) is formed on and in contact with the upper electrode 34. Thus, the upper electrode 34 is a bit line side contact.

The contact 35 is provided on the other diffusion layer 25 (the source side diffusion layer). The contact 35 is formed on and in contact with the upper surface of the other diffusion layer 25. The local source line LSL is formed on and in contact with the contact 35. Thus, the contact 35 is a source line side contact. The other diffusion layer 25 and the contact 35 are shared by two adjacent memory cells.

The lower electrode 32, the variable resistance element 33, the upper electrode 34, and the contact 35 are surrounded by an interlayer insulation layer 31.

Referring back to FIG. 4, the local sink switch 14 comprises the local bit lines LBL0-LBL3, the local source lines LSL0-LSL3, and the control lines LSSWL0-LSSWL3. The control lines LSSWL0-LSSWL3 extend in the second direction.

As shown in FIG. 6, the semiconductor substrate 21 in the local sink switch 14 includes the sink select transistor LSM. The sink select transistor LSM has a structure similar to that of the select transistor ST in the memory cell array 10. The sink select transistor LSM comprises a gate insulating layer 22, a gate electrode 23 (control line LSSWL), and two diffusion layers 25 (a drain side diffusion layer and a source side diffusion layer).

On one diffusion layer 25 (the drain side diffusion layer), a lower electrode 32, a conductive layer 41, and an upper electrode 34 are provided in this order. Thus, the local sink switch 14 comprises the conductive layer 41 in place of the variable resistance element 33 in the memory cell array 10. However, instead of the conductive layer 41, the local sink switch 14 may, similar to the memory cell array 10, comprise the variable resistance element 33. In this case, the variable resistance element 33 must be made conductive by flow of a large current to break down the tunnel barrier layer 33B.

The contact 35 is formed on the other diffusion layer 25 (the source side diffusion layer) as well as in the memory cell array 10.

Writing and Reading in First Embodiment

Figure 7:
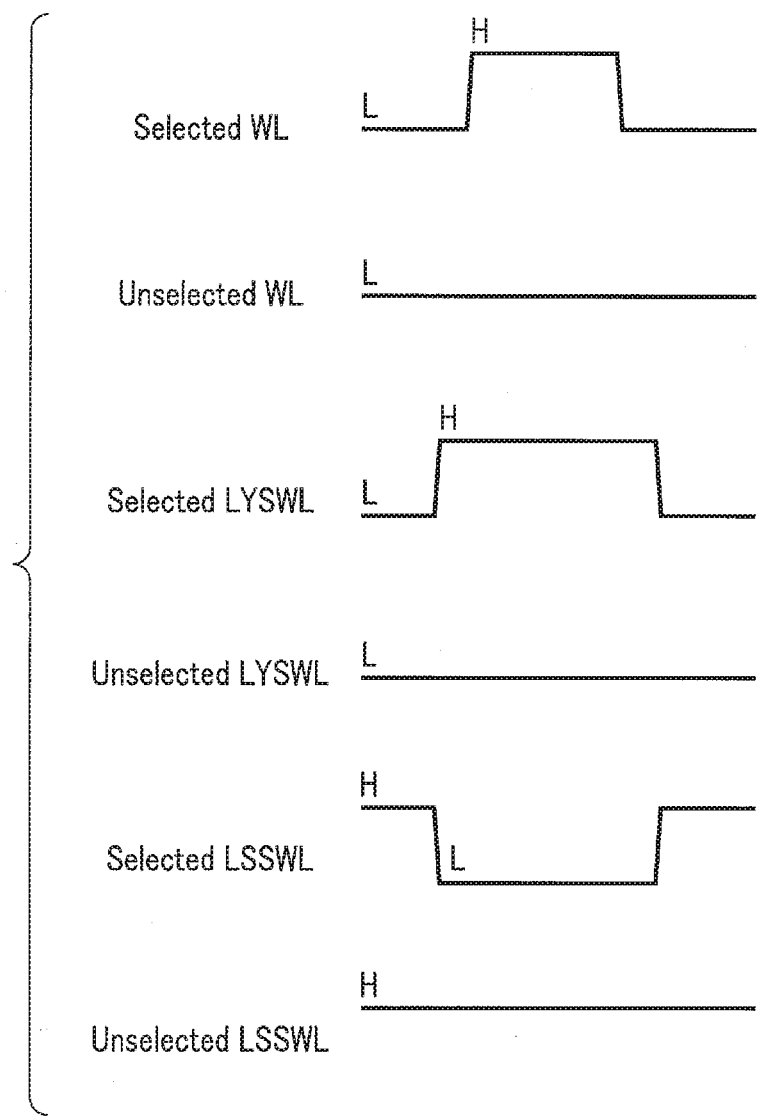
FIG. 7 is a timing chart indicating voltages at writing and reading in the semiconductor memory device according to the first embodiment.

FIG. 7 is a timing chart indicating voltages at writing and reading in the semiconductor memory device according to the first embodiment. The timing chart is applicable to both writing and reading.

As shown in FIG. 7, first, at standby time for operations, all word lines WL are at an L (Low) level, all control lines LYSWL are at the L level, and all control lines LSSWL are at an H (High) level. Accordingly, all select transistors ST are off, all column select transistors LYM are off, and all sink select transistors LSM are on.

Next, at writing and reading, the selected control line LYSWL becomes the H level, and the selected control line LSSWL becomes the L level. Accordingly, the corresponding column select transistor LYM (coupled to the selected control line LYSWL) is turned on, and the corresponding sink select transistor (coupled to the selected control line LSSWL) is turned off. Thereafter, the selected word line WL becomes the H level, and the corresponding select transistor ST (coupled to the selected word line WL) is turned on.

The writing and reading described above will be explained more specifically below with reference to FIG. 8 to FIG. 10.

Figure 9:
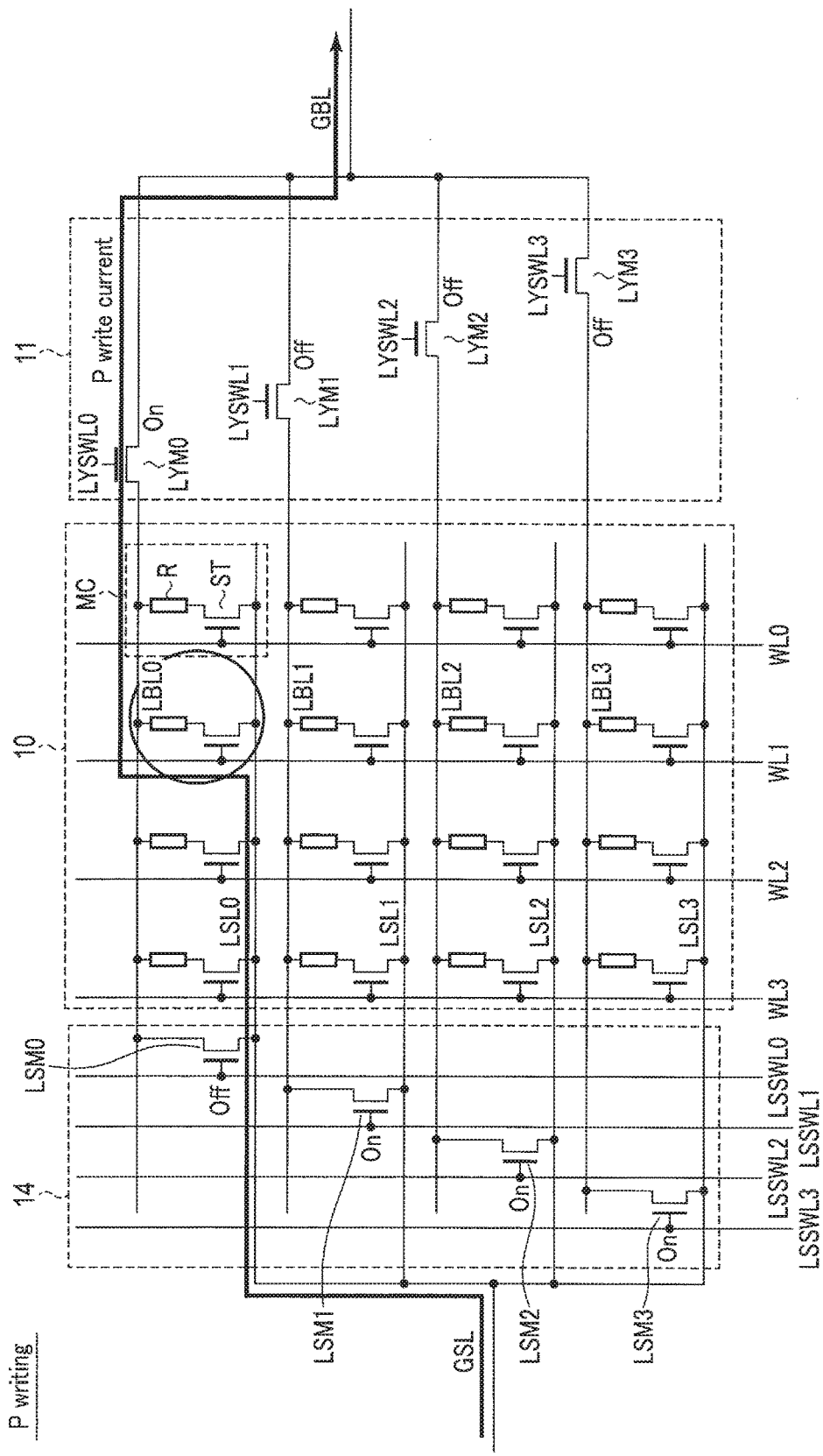
FIG. 9 is a diagram showing P writing of the semiconductor memory device according to the first embodiment.
Figure 10:
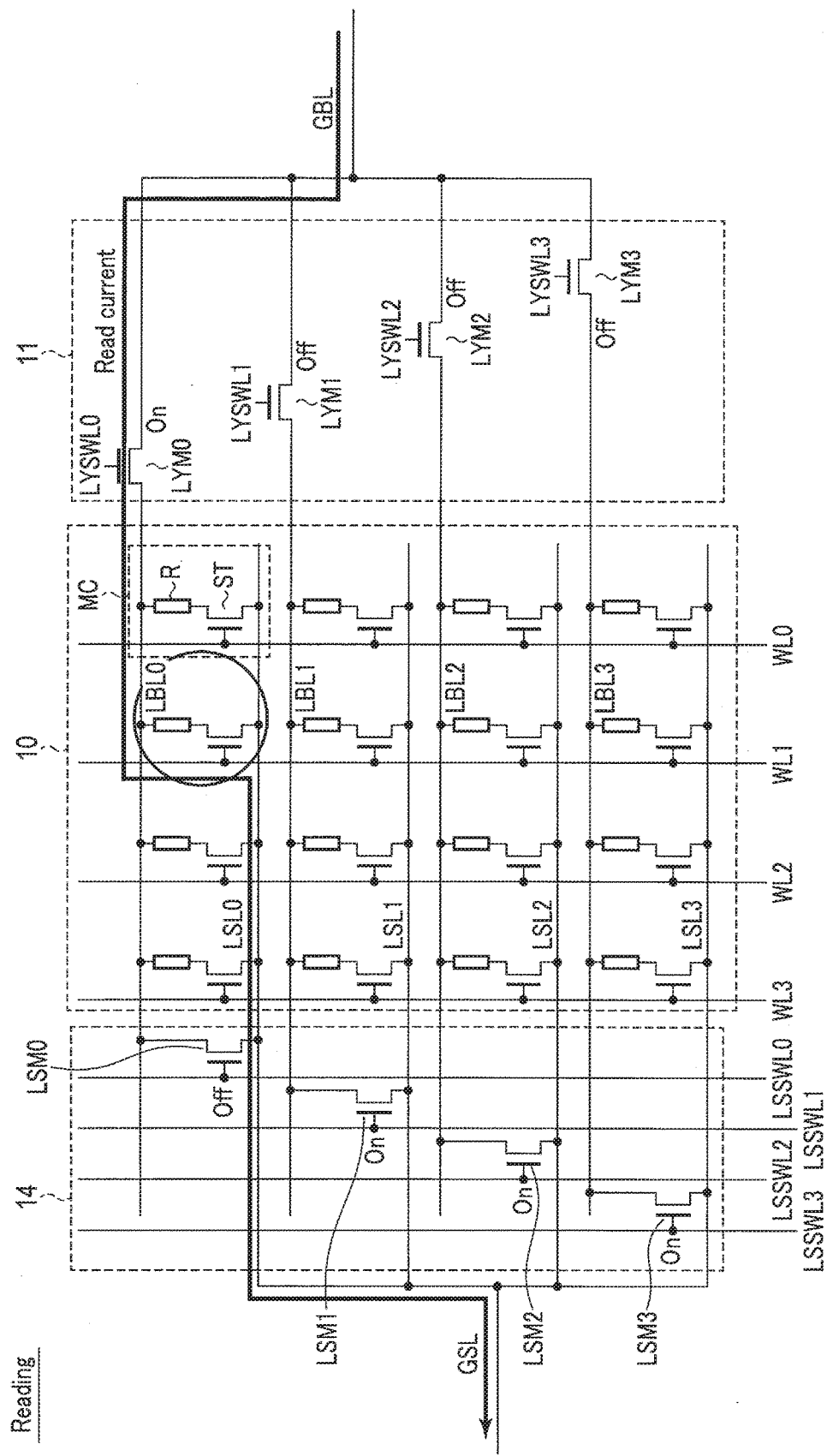
FIG. 10 is a diagram showing reading of the semiconductor memory device according to the first embodiment.

Referring to FIG. 8 to FIG. 10, writing/reading in/from the memory cell MC coupled to the local bit line LBL0, the local source line LSL0, and the word line WL1 is explained as an example. In the example described herein, AP writing is performed by flow of a write current from a bit line side to a source line side, and P writing is performed by flow of a write current from the source line side to the bit line side.

FIG. 8 is a diagram showing AP writing of the semiconductor memory device according to the first embodiment.

As shown in FIG. 8, at AP writing, the selected control line LYSWL0 becomes the H level, and the column select transistor LYM0 coupled thereto is turned on. The selected control line LSSWL0 becomes the L level, and the sink select transistor LSM0 coupled thereto is turned off. The selected word line WL1 becomes the H level, and the select transistor ST coupled thereto is turned on. An AP write voltage (for example, a source voltage VDD) is applied to the global bit line GBL, and a ground voltage (VSS) is applied to the global source line GSL. Accordingly, an AP write current flows in the global source line GSL from the global bit line GBL through the local bit line LBL0, the memory cell MC, and the local source line LSL0. The AP write current brings the variable resistance element R in the selected memory cell MC into the AP state.

On the other hand, at AP writing, the unselected control lines LYSWL1-LYSWL3 become the L level, and the column select transistors LYM1-LYM3 coupled thereto are turned off. The unselected control lines LSSWL1-LSSWL3 become the H level, and the sink select transistors LSM1-LSM3 coupled thereto are turned on. As a result, the local bit line LBL1 is brought into conduction with the local source line LSL1. Likewise, the local bit line LBL2 and the local bit line LBL3 are respectively brought into conduction with the local source line LSL2 and the local source line LSL3. The unselected word lines WL0, WL2, and WL3 become the L level, and the select transistors ST coupled thereto are turned off. At this time, since the ground voltage is applied to the global source line GSL, the ground voltage is supplied to the local source lines LSL1-LSL3 and the local bit lines LBL1-LBL3. Since the local source lines LSL1-LSL3 and the local bit lines LBL1-LBL3 have the same potential, a write current does not flow to the memory cells MC coupled thereto.

FIG. 9 is a diagram showing P writing of the semiconductor memory device according to the first embodiment.

As shown in FIG. 9, at P writing, as well as AP writing, the column select transistor LYM0 coupled to the selected control line LYSWL0 is turned on, the sink select transistor LSM0 coupled to the selected control line LSSWL0 is turned off, and the select transistor ST coupled to the selected word line WL1 is turned on. The ground voltage is applied to the global bit line GBL, and a P write voltage (for example, the source voltage VDD) is applied to the global source line GSL. Accordingly, a P write current flows in the global bit line GBL from the global source line GSL through the local bit line LBL0, the memory cell MC, and the local source line LSL0. The P write current brings the variable resistance element R in the selected memory cell MC into the P state.

On the other hand, at P writing, as well as AP writing, the column select transistors LYM1-LYM3 coupled to the unselected control lines LYSWL1-LYSWL3 are off, the sink select transistors LSM1-LSM3 coupled to the unselected control line LSSWL1-LSSWL3 are on, and the select transistors ST coupled to the unselected word lines WL0, WL2 and WL3 are off. At this time, since the P write voltage is applied to the global source line GSL, the P write voltage is supplied to the local source lines LSL1-LSL3 and the local bit lines LBL1-LBL3. Since the local source lines LSL1-LSL3 and the local bit lines LBL1-LBL3 have the same potential, a write current does not flow to the memory cells MC coupled thereto.

FIG. 10 is a diagram showing reading of the semiconductor memory device according to the first embodiment.

As shown in FIG. 10, at reading, as well as AP writing and P writing, the column select transistor LYM0 coupled to the selected control line LYSWL0 is on, the sink select transistor LSM0 coupled to the selected control line LSSWL0 is off, and the select transistor ST coupled to the selected word line WL1 is on. A read voltage (smaller than the write voltage) is applied to the global bit line GBL, and the ground voltage is applied to the global source line GSL. Accordingly, a read current flows in the global source line GSL from the global bit line GBL through the local bit line LBL0, the memory cell MC, and the local source line LSL0. Data of the variable resistance element R in the selected memory cell MC is read by detecting the read current.

On the other hand, at reading, as well as AP writing and P writing, the column select transistors LYM1-LYM3 coupled to the unselected control lines LYSWL1-LYSWL3 are off, the sink select transistors LSM1-LSM3 coupled to the unselected control line LSSWL1-LSSWL3 are on, and the select transistors ST coupled to the unselected word lines WL0, WL2, and WL3 are off. At this time, since the ground voltage is applied to the global source line GSL, the ground voltage is supplied to the local source lines LSL1-LSL3 and the local bit lines LBL1-LBL3. Since the local source lines LSL1-LSL3 and the local bit lines LBL1-LBL3 have the same potential, a read current does not flow to the memory cells MC coupled thereto.

Effect in First Embodiment

FIG. 16 is a circuit diagram showing a configuration of a semiconductor memory device according to a first comparative example. FIG. 17 is a circuit diagram showing a configuration of a semiconductor memory device according to a second comparative example. FIG. 16 and FIG. 17 show writing/reading in/from the memory cell MC coupled to the local bit line LBL0, the local source line LSL0, and the word line WL1.

As shown in FIG. 16, in the first comparative example, not only a local column switch 11A on the side of a global bit line GBL but also a local column switch 11BG on the side of a global source line GSL are provided for a memory cell array 10. The local column switch 11A includes column select transistors LYMA0-LYMA3. The column select transistors LYMA0-LYMA3 respectively connect the local bit lines LBL0-LBL3 to the common global bit line GBL. On the other hand, the local column switch 11B includes column select transistors LYMB0-LYMB3. The column select transistors LYMB0-LYMB3 respectively connect the local source lines LSL0-LSL3 to the global source line GSL.

In the first comparative example, at writing and reading, the selected column select transistors LYMA0 and LYMB0 are on. The unselected column transistors LYMA1-LYMA3 and LYMB1-LYMB3 are turned off. At this time, the unselected local bit lines LBL1-LBL3 and the unselected local source lines LSL1-LSL3 are floating. The local bit lines LBL1-LBL3 or the local source lines LSL1-LSL3 may be influenced by noise from the word line WL1 or the like, which is at the H level. As a result, if there is a difference in voltage between the local bit lines LBL1-LBL3 and the local source lines LSL1-LSL3, a write disturbance or read disturbance may occur.

As shown in FIG. 17, in the second comparative example, a bit line side discharge circuit 18A and a source line side discharge circuit 18B are provided to prevent the above mentioned disturbances. The bit line side discharge circuit 18A comprises discharge transistors DISMA0-DISMA3. One end of each of the discharge transistors DISMA0-DISMA3 is electrically coupled to each of the local bit lines LBL0-LBL3, and the other ends are electrically coupled to the ground voltage. The source line side discharge circuit 18B comprises discharge transistors DISMB0-DISMB3. One end of each of the discharge transistors DISMB0-DISMB3 is electrically coupled to each of the local source lines LSL0-LSL3, and the other ends are electrically coupled to the ground voltage.

The unselected local bit lines LBL1-LBL3 and the unselected local source lines LSL1-LSL3 can be at the ground voltage by turning on the discharge transistors DISMA1-DISMA3 and DISMB1-DISMB3. Thus, disturbances in the local bit lines LBL1-LBL3 and the local source lines LSL1-LSL3 due to floating can be prevented.

However, in the second comparative example, the bit line side discharge circuit 18A and the source line side discharge circuit 18B are required, so the circuit surface area is increased.

In contrast, the first embodiment comprises the local sink switch 14. The local sink switch 14 includes the sink select transistors LSM0-LSM3. One end of each of the sink select transistors LSM0-LSM3 is coupled to each of the local bit lines LBL0-LBL3, and the other end of each of the sink select transistors LSM0-LSM3 is coupled to each of the local source lines LSL0-LSL3. At writing and reading, the unselected local source lines LSL and the local bit line LBL are brought into conduction by turning on the unselected sink select transistors LSM. As a result, the unselected local source lines LSL and the local bit line LBL can be set to a predetermined voltage (voltage of the global source line GSL), not floating. Therefore, a disturbance in various operations can be prevented. Furthermore, the first embodiment does not need a large circuit area, since the bit line side discharge circuit 18A and the source line side discharge circuit 18B of the second comparative example are not required.

Modification of First Embodiment

In the first embodiment, at AP writing, the ground voltage VSS (for example, 0 V) is applied to the global source line GSL. At P writing, the P write voltage (for example, the source voltage VDD) is applied to the global source line GSL. Therefore, if P writing is performed after AP writing, the unselected local source lines LSL and local bit lines LBL are charged through the global source line GSL from VSS to VDD. Therefore, the charge load by the global source line GSL may be heavy.

In the modification, at AP writing and P writing, the ground voltage VSS is applied to the global source line GSL. At AP writing, similar to the embodiment described above, an AP write voltage (for example, the source voltage VDD) is applied to the global bit line GBL. On the other hand, at P writing, a negative P write voltage (for example, -VDD) is applied to the global bit line GBL. As a result, similar to the embodiment described above, the AP write current and the P write current can be caused to flow. At this time, since the global source line GSL is fixed to the ground voltages VSS at AP writing and P writing, the charge load by the global source line GSL on the unselected local source line GSL and the local bit line LBL can be reduced.

The present invention is not limited to the above, but ½ VDD may be applied to the global source line GSL at AP writing and P writing. In this case, VDD is applied to the global bit line GBL at AP writing, and VSS is applied to the global bit line GBL at P writing. As a result, similar to the embodiment described above, the AP write current and the P write current can be caused to flow. At this time, since the global source line GSL is fixed to ½ VDD at AP writing and P writing, the charge load by the global source line GSL on the unselected local source line GSL and the local bit line LBL can be reduced. Furthermore, since it is unnecessary to apply a negative voltage, voltage control is easier.

Also, ordinarily, the AP write current needs to be larger than the P write current. Therefore, at AP writing and P writing, the global source line GSL may be fixed to ⅓ VDD, not ½ VDD. In this case, VDD is applied to the global bit line GBL at AP writing, and VSS is applied to the global bit line GBL at P writing. As a result, the difference in voltage between the global source line GSL and the global bit line GBL at AP writing is greater than the difference in voltage at P writing. Thus, the AP write current can be greater than the P write current, and a required voltage can be appropriately generated.

Second Embodiment

In the following, a semiconductor memory device according to a second embodiment will be explained with reference to FIG. 11. In the second embodiment, explanations on the matters which are the same as in the first embodiment are omitted, and matters which are different are mainly explained.

Configuration in Second Embodiment

Figure 11:
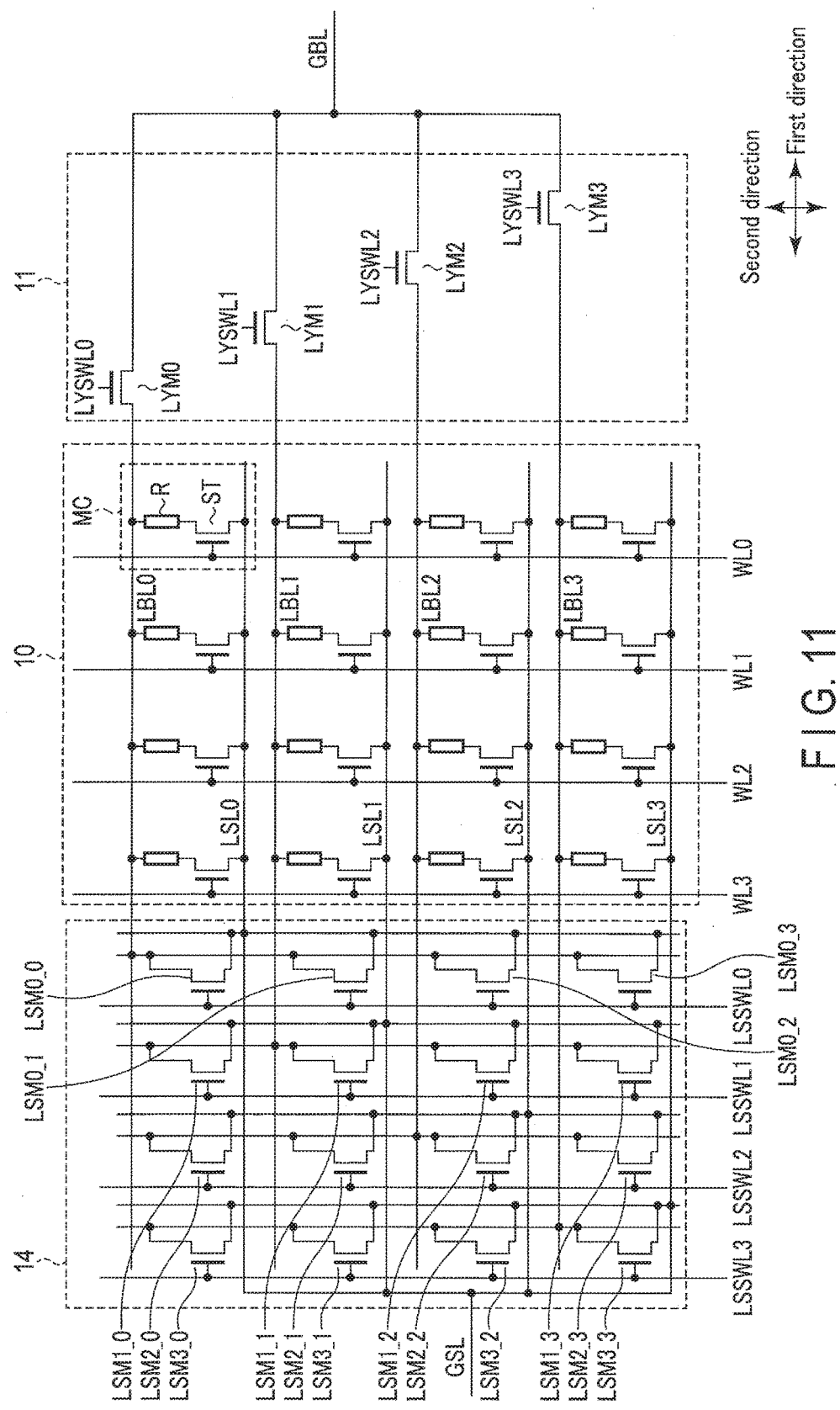
FIG. 11 is a circuit diagram showing configurations of a memory cell array, a local column switch, and a local sink switch in a semiconductor memory device according to a second embodiment.

FIG. 11 is a circuit diagram showing configurations of a memory cell array 10, a local column switch 11, and a local sink switch 14 in the semiconductor memory device according to the second embodiment. FIG. 11 shows a bank in the semiconductor memory device.

The second embodiment differs from the first embodiment in that a plurality of sink select transistors LSM are provided in parallel between a local bit line LBL and a local source line LSL.

As shown in FIG. 11, the local sink switch 14 includes control lines LSSWL0-LSSWL3 extending in the second direction. The local sink switch 14 also includes sink select transistors LSM0_0-LSM3_3.

The sink select transistors LSM0_0-LSM0_3 are arranged in the second direction. One end of each of the sink select transistors LSM0_0-0_3 is electrically coupled to the local bit line LBL0, and the other ends are electrically coupled to the local source line LSL0. Thus, the sink select transistors LSM0_0-0_3 are coupled in parallel between the local bit line LBL0 and the local source line LBL0.

Similarly, the sink select transistors LSM1_0-1_3 are arranged in the second direction, one end of each of which is electrically coupled to the local bit line LBL1, and the other ends are electrically coupled to the local source line LBL1. The sink select transistors LSM2_0-LSM2_3 are arranged in the second direction, one end of each of which is electrically coupled to the local bit line LBL2, and the other ends are electrically coupled to the local source line LBL2. The sink select transistors LSM3_0-LSM3_3 are arranged in the second direction, one end of each of which are electrically coupled to the local bit line LBL3, and the other ends are electrically coupled to the local source line LSL3.

The sink select transistors LSM0_0, LSM1_0, LSM2_0, and LSM3_0 are arranged in the first direction. Similarly, the sink select transistors LSM0_1, LSM1_1, LSM2_1, and LSM3_1 are arranged in the first direction. The sink select transistors LSM0_2, LSM1_2, LSM2_2, and LSM3_2 are arranged in the first direction. The sink select transistors LSM0_3, LSM1_3, LSM2_3, and LSM3_3 are arranged in the first direction.

Writing and Reading in Second Embodiment

Writing and Reading will be explained below. In the following, writing/reading in/from the memory cell MC coupled to the local bit line LBL0, the local source line LSL0, and the word line WL1 is explained as an example.

At AP writing, the column select transistor LYM0 coupled to the selected control line LYSWL0 is on, the sink select transistors LSM0_0 to LSM0_3 coupled to the selected control line LSSWL0 are off, and the select transistor ST coupled to the selected word line WL1 is on. There is a difference in voltage between the global bit line GBL and the global source line GSL. Accordingly, an AP write current flows in the memory cell MC coupled to the local bit line LBL0 and the local source line LSL0.

On the other hand, at AP writing, the column select transistors LYM1-LYM3 coupled to the unselected control lines LYSWL1-LYSWL3 are off, and the select transistors ST coupled to the unselected word lines WL0, WL2 and WL3 are off. The sink select transistors LSM1_0 to LSM1_3 coupled to the unselected control line LSSWL1, the sink select transistors LSM2_0 to LSM2_3 coupled to the unselected control line LSSWL2, and the sink select transistors LSM3_0 to LSM3_3 coupled to the unselected control line LSSWL3 are on. At this time, a predetermined voltage of the global source line GSL is supplied to the local source lines LSL1-LSL3 and the local bit lines LBL1-LBL3. Since the local source lines LSL1-LSL3 and the local bit lines LBL1-LBL3 have the same potential, a write current does not flow to the memory cells MC coupled thereto.

At P writing and reading, similarly, the sink select transistors LSM0_0 to LSM0_3 coupled to the selected control line LSSWL0 are off. On the other hand, the sink select transistors LSM1_0 to LSM1_3 coupled to the unselected control line LSSWL1, the sink select transistors LSM2_0 to LSM2_3 coupled to the unselected control line LSSWL2, and the sink select transistors LSM3_0 to LSM3_3 coupled to the unselected control line LSSWL3 are on. Accordingly, P write current and read current flow in the memory cell MC coupled to the local bit line LBL0 and the local source line LSL0, whereas P write current and read current do not flow to the memory cells MC coupled to the local bit lines LBL1-LBL3 and the local source lines LSL1-LSL3.

Effect in Second Embodiment

In the second embodiment, the local sink switch 14 includes the sink select transistors LSM0_0-LSM3_3. The sink select transistors LSM0_0-0_3 are coupled in parallel between the local bit line LBL0 and the local source line LSL0. The sink select transistors LSM1_0-1_3 are coupled in parallel between the local bit line LBL1 and the local source line LSL1. The sink select transistors LSM2_0-2_3 are coupled in parallel between the local bit line LBL2 and the local source line LSL2. The sink select transistors LSM3_0-3_3 are coupled in parallel between the local bit line LBL3 and the local source line LSL3. Because of the sink select transistors LSM coupled in parallel, when the local bit lines LBL and the local source lines LSL are respectively brought to conduction, the resistance between them can be low.

Third Embodiment

A semiconductor memory device according to a third embodiment will be explained with reference to FIG. 12 and FIG. 13. In the third embodiment, explanations on those matters which are the same as in the first embodiment are omitted, and mainly those matters which are different are explained.

Configuration in Third Embodiment

FIG. 12 is a circuit diagram showing a configuration of a semiconductor memory device according to the third embodiment. FIG. 12 shows one MAT.

The MAT is a unit including banks BK0-BKN that share a word line WL. The bank BK includes a local column switch 11 (local column switch driver), a local sink switch 14 (local sink switch), and a memory cell array 10. The bank is a unit, to which a global source line GSL, a global bit line GBL, and a sense amplifier SA are electrically coupled.

The third embodiment differs from the first embodiment in that a select transistor SLM electrically coupled to each of the banks BK is provided.

As shown in FIG. 12, the MAT includes the banks BK0-BKN. The bank BK0 comprises a memory cell array 10_0, a local column switch 11_0, and a local sink switch 14_0. The local column switch 11_0 is electrically coupled to a sense amplifier 13_0 via the global bit line GBL0. The local sink switch 14_0 (the other end of a sink select transistor LSM (a local source line LSL)) is electrically coupled to one end of a select transistor SLM0. The other end of the select transistor SLM0 is electrically coupled to the global source line GSL. A gate of the select transistor SLM0 is electrically coupled to a control line SLPRL0.

The banks BK1-BKN have a configuration similar to that of the bank BK0. In other words, the banks BK1-BKN respectively comprise memory cell arrays 10_1-10_N, local column switches 11_1-11_N, and local sink switches 14_1-14_N. Each of the local column switches 11_1-11_N is electrically coupled to each of the sense amplifiers 13_1-13_N through each of global bet lines GBL1-GBLN. Each of the local sink switches 14_1-14_N (the other end of the sink select transistor LSM (the local source line LSL)) is electrically coupled to one end of each select transistor SLM1-SLMN. The other end of each of the select transistors SLM1-SLMN is electrically coupled to each of the global source lines GSL1-GSLN.

Gates of each of the select transistors SLM0-SLMN in the banks BK0-BKN are each electrically coupled to control lines SLPRL0-SLPRLN. In other words, the gates of the select transistors SLM0-SLMN are independent of each other.

The global source lines GSL0-GSLN are each electrically coupled to different control circuits (a write driver, a sink, etc.).

Writing and Reading in Third Embodiment

Figure 13:
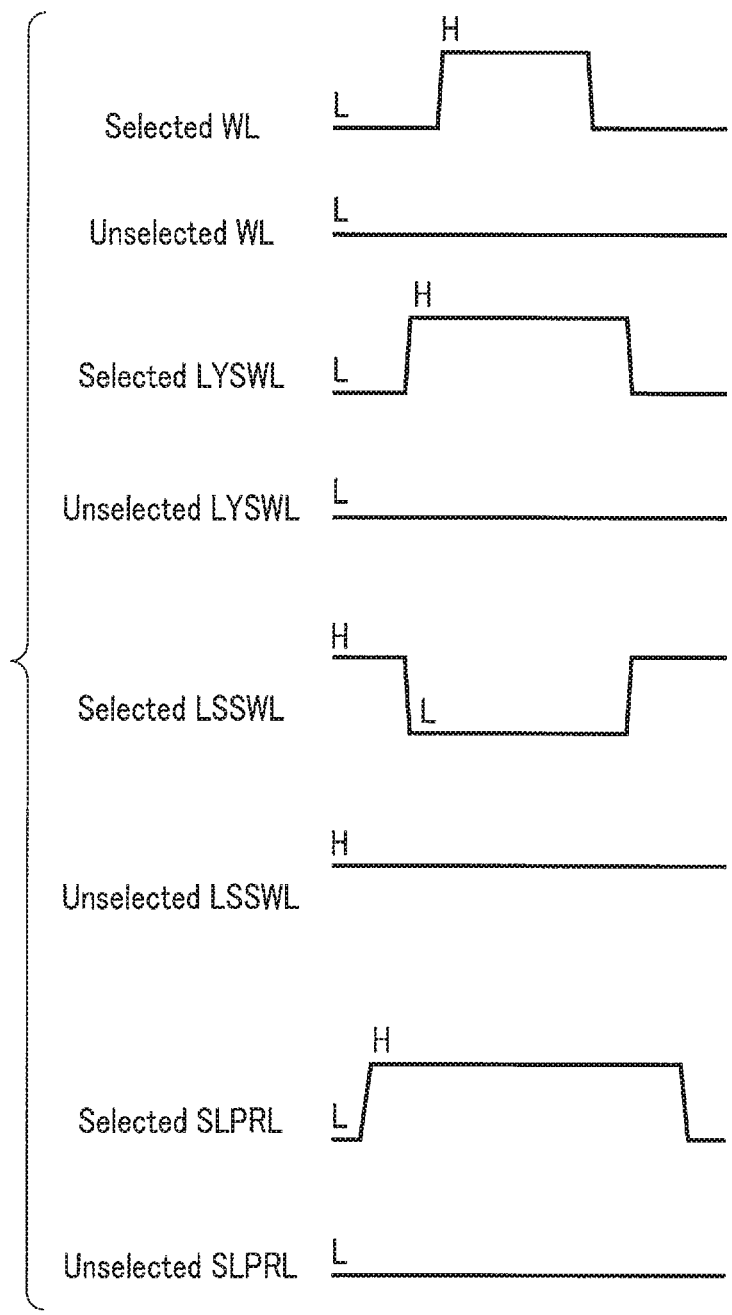
FIG. 13 is a timing chart indicating voltages at writing and reading in the semiconductor memory device according to the third embodiment.

FIG. 13 is a timing chart indicating voltages at writing and reading in the semiconductor memory device according to the third embodiment. The timing chart is applicable to both writing and reading.

As shown in FIG. 13, first, at standby time for operations, all word lines WL are at an L level, all control lines LYSWL are at the L level, all control lines LSSWL are at an H level, and all control lines SLPRL are at the L level. Accordingly, all select transistors ST are off, all column select transistors LYM are off, all sink select transistors LSM are on and all select transistors SLM are off.

Then, at writing and reading, the selected control lines SLPRL become the H level. Accordingly, the corresponding select transistor SLM is turned on. Thereafter, operations similar to those in the first embodiment are carried out. Specifically, after the selected control line LYSWL becomes the H level and the selected control line LSSWL becomes the L level, the selected word line WL becomes the H level.

Effect in Third Embodiment

In the third embodiment described above, the select transistors SLM0-SLMN are respectively interposed between the banks BK0-BKN and the global source lines GSL0-GSLN. The gates of the select transistors SLM0-SLMN are controlled independently of each other. Therefore, writing and reading can be selectively performed in units of bank BK by controlling on/off the select transistors SLM0-SLMN. Thus, operations of the unselected banks BK can be suppressed, resulting in a reduction in power consumption.

Modification of Third Embodiment

In the third embodiment, writing and reading are selectively performed in units of bank BK. In the modification, select transistors SLM0-SLMN in a MAT share a gate, and writing and reading are selectively performed in units of MAT.

FIG. 14 is a circuit diagram showing a configuration of a semiconductor memory device according to the modification of the third embodiment. FIG. 14 shows one MAT.

As shown in FIG. 14, the select transistors SLM0-SLMN in the banks BK0-BKN share a gate electrically coupled to a control line SLPRL_M. Although not shown in the drawings, the gates of the select transistors SLM0-SLMN are independent of gates of select transistors SLM of another MAT. In other words, the gates of the select transistors SLM0-SLMN are independent in units of MAT.

Figure 15:
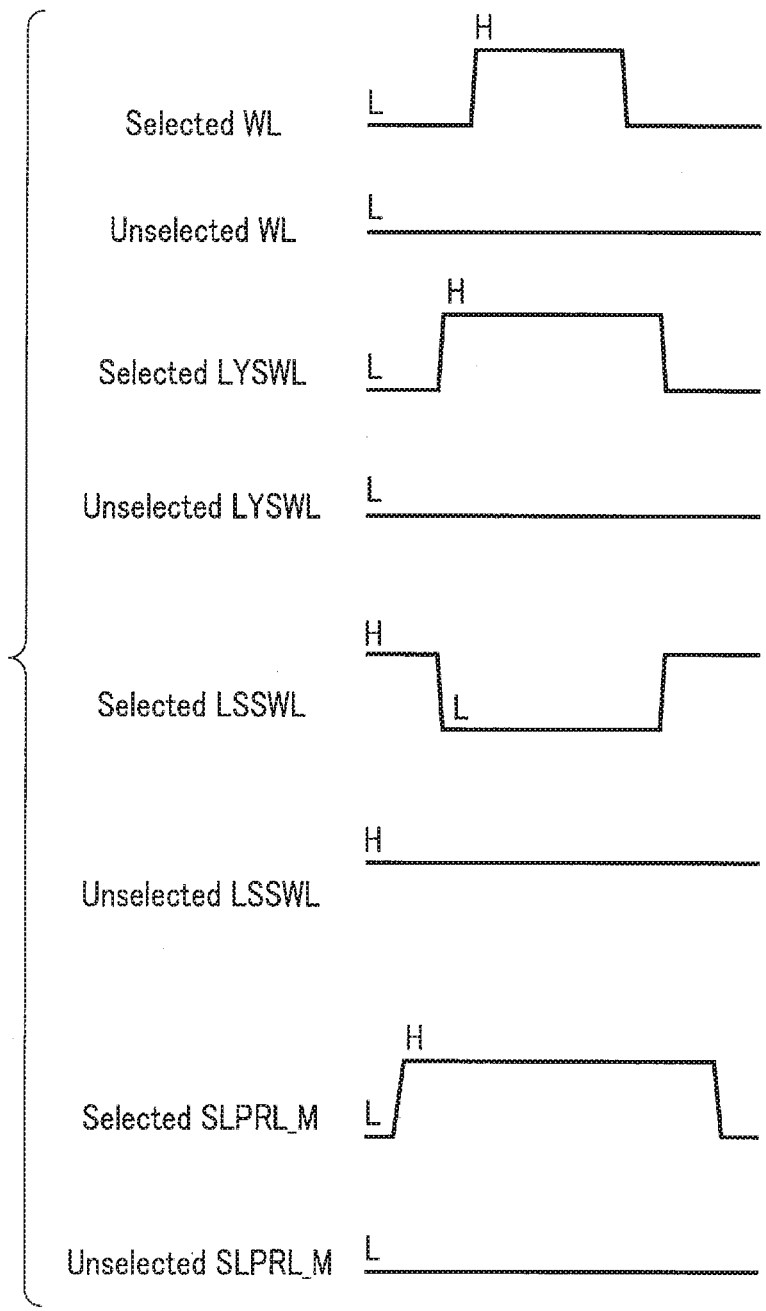
FIG. 15 is a timing chart indicating voltages at writing and reading in the semiconductor memory device according to the modification of the third embodiment.

FIG. 15 is a timing chart indicating voltages at writing and reading in the semiconductor memory device according to the modification of the third embodiment. The timing chart is applicable to both writing and reading.

As shown in FIG. 15, first, at standby time for operations, all word lines WL are at an L (Low) level, all control lines LYSWL are at the L level, all control lines LSSWL are at an H (High) level, and all control lines SLPRL_M are at the L level. Accordingly, all select transistors ST are off, all column select transistors LYM are off, all sink select transistors LSM are on and all select transistors SLM are off.

Then, at writing and reading, the selected control lines SLPRL_M become the H level. Accordingly, all select transistors SLM in the MAT are turned on. Thereafter, operations similar to those in the first embodiment are carried out. Specifically, after the selected control line LYSWL becomes the H level and the selected control line LSSWL becomes the L level, the selected word line WL becomes the H level.

As described above, according to the modification, writing and reading can be carried out in units of MAT, resulting in a reduction in power consumption as in the third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first bit line extending in a first direction;
   a first source line extending in the first direction;
   a first word line extending in a second direction crossing the first direction;
   a first control line extending in the second direction;
   a first memory cell comprising a first variable resistance element and a first transistor, the first transistor including a gate coupled to the first word line, the first memory cell including one end coupled to the first bit line and another end coupled to the first source line;
   a second transistor including one end coupled to the first bit line; and
   a third transistor including a gate coupled to the first control line, one end coupled to the first bit line, and another end coupled to the first source line.

2. The device of claim 1, wherein at writing, when the first memory cell is a writing-target cell, the second transistor is on and the third transistor is off.

3. The device of claim 1, wherein at writing, when the first memory cell is a non-writing-target cell, the second transistor is off and the third transistor is on.

4. The device of claim 1, wherein at reading, when the first memory cell is a reading-target cell, the second transistor is on and the third transistor is off.

5. The device of claim 1, wherein at reading, when the first memory cell is a non-reading-target cell, the second transistor is off and the third transistor is on.

6. The device of claim 1, further comprising a fourth transistor including a gate coupled to the first control line, one end coupled to the first bit line, and another end coupled to the first source line.

7. The device of claim 6, wherein the fourth transistor is arranged with the third transistor in the second direction.

8. The device of claim 1, wherein:
   at first writing for writing a first logical value in the first memory cell, a first voltage is applied to the first source line and a second voltage higher than the first voltage is applied to the first bit line; and
   at second writing for writing a second logical value in the first memory cell, the first voltage is applied to the first source line and a third voltage lower than the first voltage is applied to the first bit line.

9. The device of claim 1, further comprising:
   a second bit line extending in the first direction;
   a second source line extending in the first direction;
   a second word line extending in the second direction;
   a second control line extending in the second direction;
   a second memory cell comprising a second variable resistance element and a fifth transistor, the fifth transistor including a gate coupled to the first word line, the second memory cell including one end coupled to the second bit line and another end coupled to the second source line;
   a sixth transistor including one end coupled to the second bit line;
   a seventh transistor including a gate coupled to the second control line, one end coupled to the second bit line, and another end coupled to the second source line;
   an eighth transistor including one end coupled to the first source line and another end coupled to a first circuit; and
   a ninth transistor including one end coupled to the second source line and another end coupled to a second circuit.

10. The device of claim 9, wherein a gate of the eighth transistor and a gate of the ninth transistor are two different gates.

11. The device of claim 9, wherein a gate of the eighth transistor and a gate of the ninth transistor are connected to a common word line.

12. A semiconductor memory device comprising:
    a first bit line extending in a first direction;
    a first source line extending in the first direction;
    a first control line extending in a second direction crossing the first direction;
    a first memory cell comprising a first variable resistance element and a first transistor, the first memory cell including one end coupled to the first bit line and another end coupled to the first source line; and
    a second transistor including a gate coupled to the first control line, one end coupled to the first bit line, and another end coupled to the first source line.

13. The device of claim 12, wherein at writing, when the first memory cell is a writing-target cell, the second transistor is off.

14. The device of claim 12, wherein at writing, when the first memory cell is a non-writing-target cell, the second transistor is on.

15. The device of claim 12, wherein at reading, when the first memory cell is a reading-target cell, the second transistor is off.

16. The device of claim 12, wherein at reading, when the first memory cell is a non-reading-target cell, the second transistor is on.

17. The device of claim 12, further comprising a third transistor including a gate coupled to the first control line, one end coupled to the first bit line, and another end coupled to the first source line.

18. The device of claim 17, wherein the third transistor is arranged with the second transistor in the second direction.

19. The device of claim 12, wherein
    at first writing for writing a first logical value in the first memory cell, a first voltage is applied to the first source line and a second voltage higher than the first voltage is applied to the first bit line; and
    at second writing for writing a second logical value in the first memory cell, the first voltage is applied to the first source line and a third voltage lower than the first voltage is applied to the first bit line.

20. The device of claim 12, comprising
    a second bit line extending in the first direction;
    a second source line extending in the first direction;
    a second control line extending in the second direction;
    a second memory cell comprising a second variable resistance element and a fourth transistor, the second memory cell including one end coupled to the second bit line and another end coupled to the second source line;
    a fifth transistor including a gate coupled to the second control line, one end coupled to the second bit line and another end coupled to the second source line;
    a sixth transistor including one end coupled to the first source line and another end coupled to a first circuit; and
    a seventh transistor including one end coupled to the second source line and another end coupled to a second circuit.

* * * * *